United States Patent
Lin et al.

(10) Patent No.: US 9,478,676 B2
(45) Date of Patent: Oct. 25, 2016

(54) LIGHT SENSING DEVICE HAVING A COVER WITH A HOLE FOR PASSING LIGHT AND METHOD OF SELECTIVELY ENABLING LIGHT SENSING ELEMENT IN LIGHT SENSING DEVICE

(71) Applicant: SensorTek technology Corp., Hsinchu County (TW)

(72) Inventors: Meng-Yong Lin, Hsinchu County (TW); Feng-Jung Hsu, Hsinchu County (TW); Ming-Huang Liu, Hsinchu County (TW)

(73) Assignee: SensorTek technology Corp., Hsinchu County (TW)

( * ) Notice: Subject to any disclaimer, the term of this patent is extended or adjusted under 35 U.S.C. 154(b) by 140 days.

(21) Appl. No.: 14/548,296

(22) Filed: Nov. 20, 2014

(65) Prior Publication Data
US 2015/0357483 A1    Dec. 10, 2015

Related U.S. Application Data

(60) Provisional application No. 62/007,420, filed on Jun. 4, 2014.

(51) Int. Cl.
 *H01L 31/0203* (2014.01)
 *H01L 27/144* (2006.01)
 *H01L 31/18* (2006.01)

(52) U.S. Cl.
 CPC ....... *H01L 31/0203* (2013.01); *H01L 27/1446* (2013.01); *H01L 31/18* (2013.01)

(58) Field of Classification Search
 CPC ............. H01L 27/146; H01L 31/0203; H01L 31/0202; H01L 31/021
 USPC .......................... 250/216, 214.1, 239, 208.1
 See application file for complete search history.

(56) References Cited

U.S. PATENT DOCUMENTS

| | | | |
|---|---|---|---|
| 7,414,423 B2 * | 8/2008 | Lu | H04N 17/002 257/E27.13 |
| 8,619,249 B2 * | 12/2013 | Meijer | G01S 3/7835 250/505.1 |
| 2014/0191113 A1 * | 7/2014 | Atwater | H01L 27/14621 250/208.1 |

* cited by examiner

*Primary Examiner* — Que T Le
(74) *Attorney, Agent, or Firm* — Winston Hsu; Scott Margo

(57) ABSTRACT

A light sensing device includes a substrate, a plurality of light sensing elements and a cover. The plurality of light sensing elements are disposed on the substrate for sensing light. The cover is utilized for sheltering the plurality of light sensing elements, wherein the cover includes a hole for passing the light. A set of the plurality of light sensing elements is selected to be enabled according to a location of the hole relative to the plurality of light sensing elements.

14 Claims, 12 Drawing Sheets

LIGHT SENSING DEVICE HAVING A COVER WITH A HOLE FOR PASSING LIGHT AND METHOD OF SELECTIVELY ENABLING LIGHT SENSING ELEMENT IN LIGHT SENSING DEVICE

CROSS REFERENCE TO RELATED APPLICATIONS

This application claims the benefit of U.S. Provisional Application No. 62/007,420 filed on Jun. 4, 2014, the contents of which are incorporated herein by reference.

BACKGROUND OF THE INVENTION

1. Field of the Invention

The present invention relates to a light sensing device and a method of arranging light sensing elements, and more particularly, to a light sensing device and a method of arranging a plurality of light sensing elements for light sensing in the light sensing device.

2. Description of the Prior Art

With advances in technology, mobile devices such as smart phones and tablets have become indispensable in our daily life. Compared with conventional mobile phones that only have communication functions, modern mobile devices combine various functions such as communication, networking, photographing, games and data processing. This type of multifunctional design is more attractive to consumers.

Since mobile devices are equipped with diversified functions, various sensing devices have to be utilized for sensing peripheral environments in order to perform corresponding applications. Common sensing devices include ambient light sensors, proximity sensors, etc. The ambient light sensors are capable of detecting ambient light by using light sensing elements, and the detected light strength is converted into electronic signals and then undergoes subsequent signal processing. The proximity sensors send light signals with a specific wavelength (e.g., infrared rays), and then detect the light signals via specific light sensing elements, where the strength or time of the detected light signals is utilized for determining the distance or movement of an object in the front.

However, the light sensors or proximity sensors may not possess a satisfactory sensing effect due to the process mismatch or fabrication mismatch. For example, the proximity sensor has to sense a specific light signal emitted by a specific light emitter and reflected by an external object. If a deviation appears on the location of the sensor, the location of the external object may not be accurately determined via reflection of the light. In addition, since the light sensor is mainly utilized for detecting tiny variations on the light, it is highly sensitive to strength of ambient light. If the process mismatch or fabrication mismatch generates a deviation between the light sensing device and the hole for receiving light, the detected light strength may be weaker. An available solution for this is to compensate for the weakened light signals by amplifying the circuit signals in the back-end after the light signals are converted into the circuit signals, wherein the amplification degree may be adjusted via testing. This method, however, is always accompanied by amplifications of non-ideal characteristics, e.g., noise or crosstalk. In addition, the above method cannot deal with the influences caused by a reduced view angle. Thus, there is a need for improvement over the prior art.

SUMMARY OF THE INVENTION

It is therefore an objective of the present invention to provide a light sensing device and a method of arranging light sensing elements which is capable of arranging a plurality of light sensing elements in the light sensing device and selecting to enable specific light sensing element(s) among the plurality of light sensing elements to achieve consistency of light sensitivity and view angle according to the situation of the process mismatch or fabrication mismatch or according to different requirements.

The present invention discloses a light sensing device, which comprises a substrate, a plurality of light sensing elements and a cover. The plurality of light sensing elements are disposed on the substrate for sensing light. The cover is utilized for sheltering the plurality of light sensing elements, wherein the cover comprises a hole for passing the light. A set of the plurality of light sensing elements is selected to be enabled according to a location of the hole relative to the plurality of light sensing elements.

The present invention further discloses a method of arranging light sensing elements for a light sensing device. The method comprises disposing a plurality of light sensing elements on a substrate for sensing light; disposing a cover for sheltering the plurality of light sensing elements, wherein the cover comprises a hole for passing the light; and selecting to enable a set of the plurality of light sensing elements according to a location of the hole relative to the plurality of light sensing elements.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
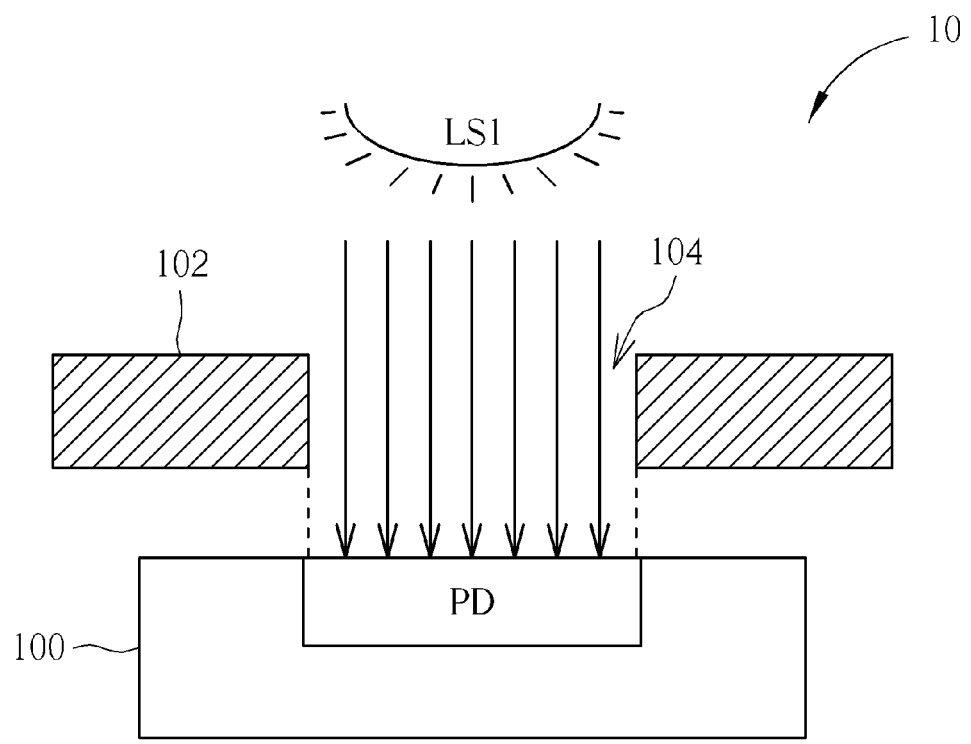
FIG. 1A, FIG. 1B, FIG. 1C, FIG. 1D and FIG. 1E are side view diagrams of a common light sensing device.
Figure 1B:
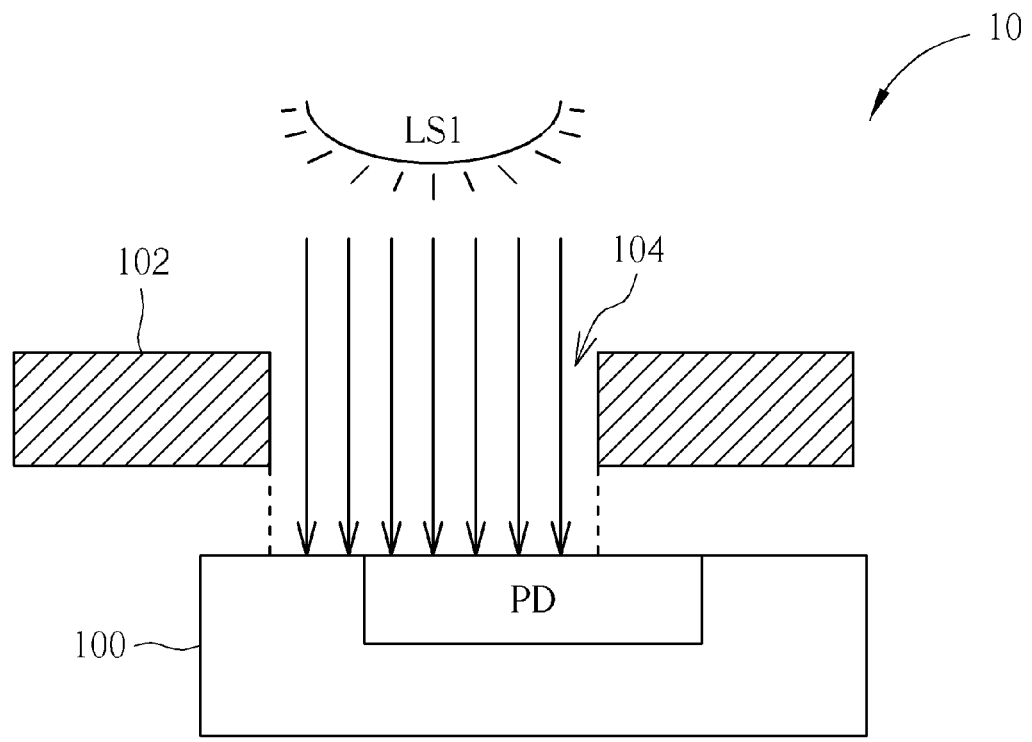
Figure 1C:
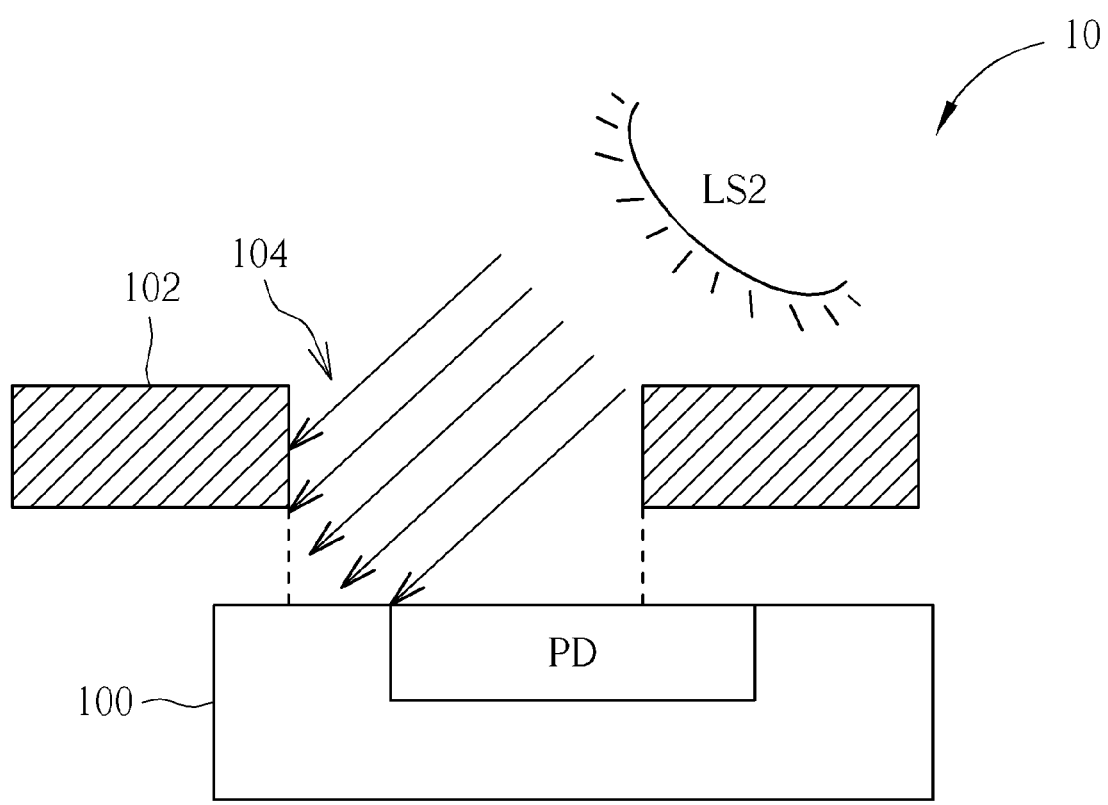
Figure 1D:
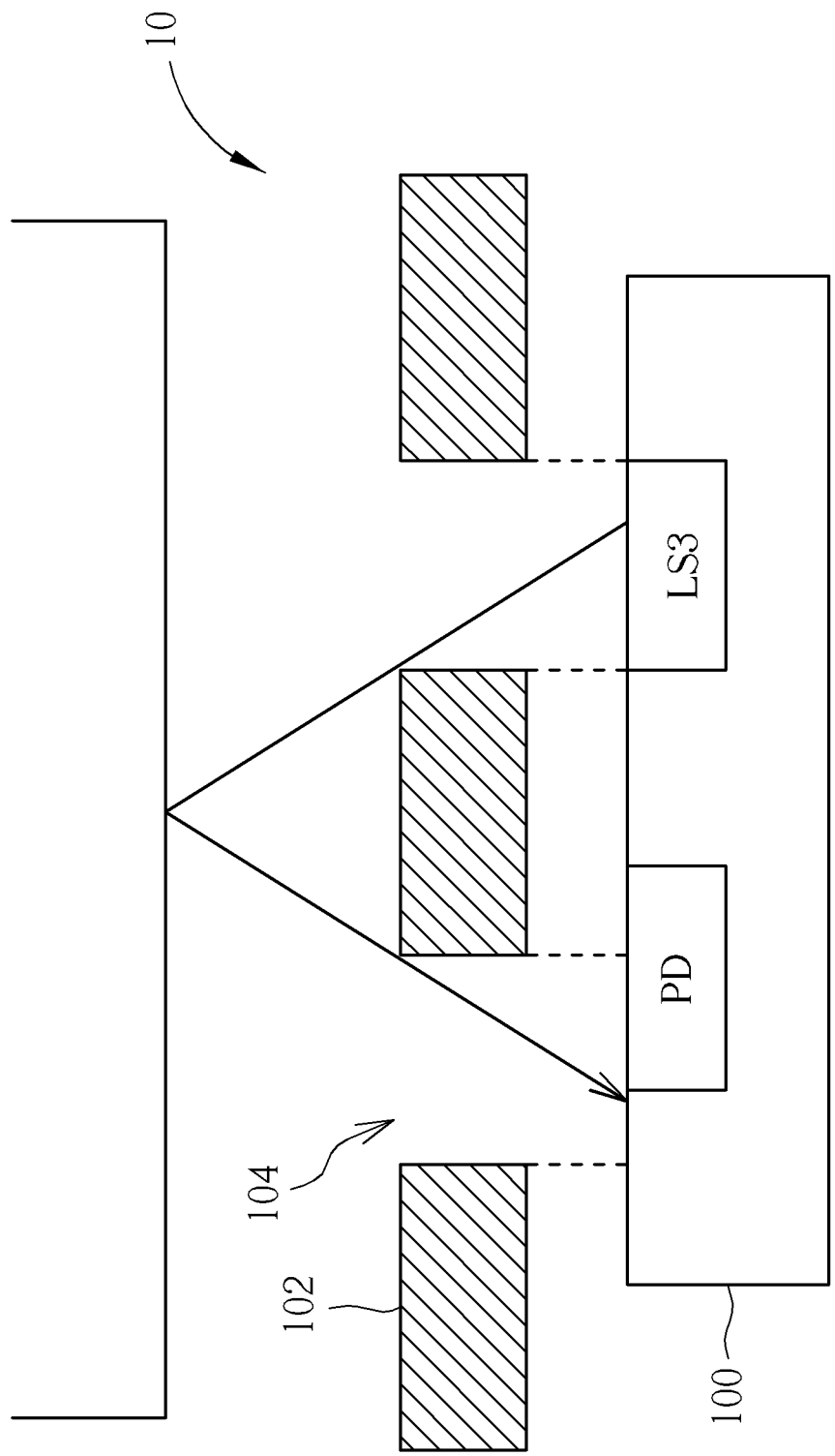
Figure 1E:
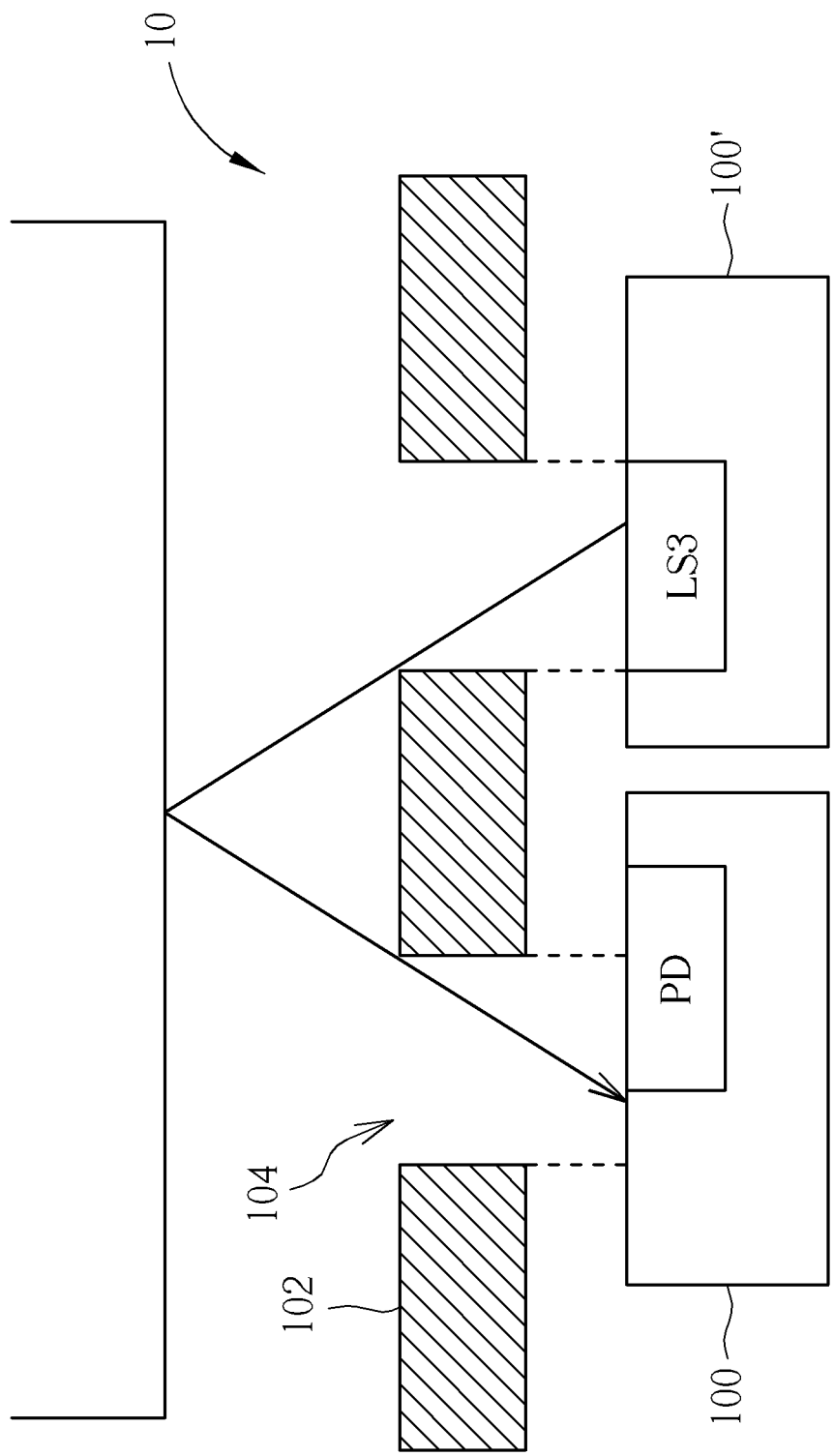

Please refer to FIG. 1A, FIG. 1B, FIG. 1C, FIG. 1D and FIG. 1E, which are side view diagrams of a common light sensing device 10. The light sensing device 10 includes a substrate 100, a light sensing element PD and a cover 102. The cover 102 includes a hole 104 for passing light. FIG. 1E further includes a substrate 100' in addition to the substrate 100. FIG. 1A illustrates that the light sensing device 10 has an excellent production and fabrication so that the hole 104 may exactly aim at the light sensing element PD. FIG. 1B, FIG. 1C, FIG. 1D and FIG. 1E illustrate deviations between the light sensing element PD and the hole 104 caused by the process mismatch or fabrication mismatch. In FIG. 1A and FIG. 1B, a light source LS1 is right above the light sensing element PD. In FIG. 1C, a light source LS2 is on the upper right side of the light sensing element PD. The light sensing element PD shown in FIG. 1D and FIG. 1E is utilized for receiving the light emitted by a source LS3 within the light sensing device 10, as the case in a proximity sensor. In FIG. 1A, the hole 104 exactly aims at the light sensing element PD, and the light emitted downward by the light source LS1 may pass through the hole 104 and totally be received by the light sensing element PD. In FIG. 1B, there is a deviation between the light sensing element PD and the hole 104, such that only a part of the light emitted downward by the light source LS1 can pass through the hole 104 and be received by the light sensing element PD; hence, the received light strength may be reduced. In FIG. 1C, the hole 104 is deviated to the left-hand side of the light sensing element PD, such that the light emitted by the light source LS2 at the right-hand side cannot be received by the light sensing element PD, which means that the view angle of the light sensing element PD at the right-hand side is reduced. Therefore, when the light sensing device turns around, the deviation of the hole 104 may cause non-consistency of the light strength received by the light sensing element PD, especially when the location of the light source is inverse to the deviation direction of the hole 104. In FIG. 1D and FIG. 1E, the hole 104 deviates to the left-hand side of the light sensing element PD, which also causes that the light emitted by the light source LS3 at the right-hand side cannot be received by the light sensing element PD via reflection. The main difference between FIG. 1D and FIG. 1E is that the light sensing element PD and the light source LS3 are disposed on the same substrate 100 in FIG. 1D, but the light sensing element PD and the light source LS3 are disposed on the substrate 100 and the substrate 100', respectively, in FIG. 1E. However, no matter whether the light sensing element PD and the light source LS3 are located in the same substrate or different substrates, the problem where the reduced view angle causes the light sensing element PD cannot receive the light emitted by the light source LS3 may occur when there is a deviation between the light sensing element PD and the hole 104.

Figure 2:
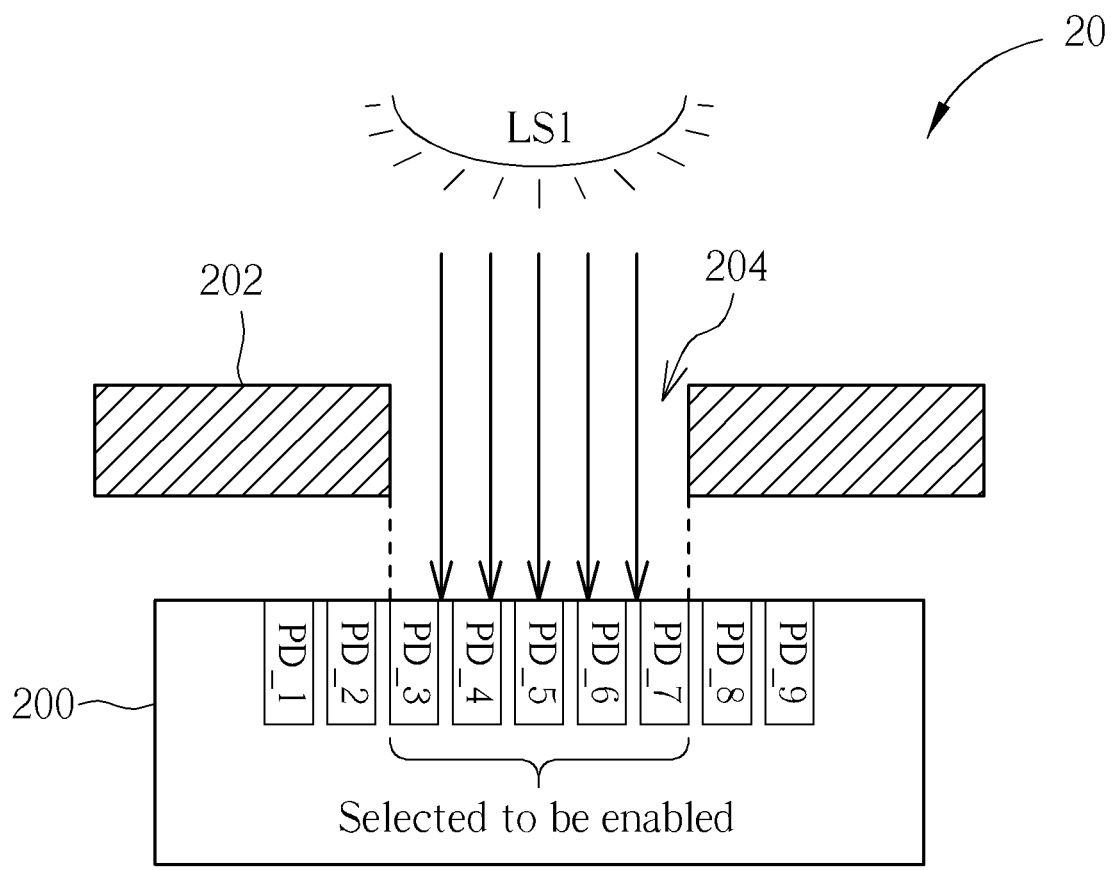
FIG. 2 is a side view diagram of a light sensing device according to an embodiment of the present invention.

Different from the prior art where signal amplifications in the back-end circuits are utilized for solving the above problem, the present invention may achieve consistency of the light sensitivity and view angle by arranging a plurality of light sensing elements on a light sensing device and selectively enabling several of the plurality of light sensing elements according to the location of the hole relative to the plurality of light sensing elements. In detail, please refer to FIG. 2, which is a side view diagram of a light sensing device 20 according to an embodiment of the present invention. As shown in FIG. 2, the light sensing device 20 includes a substrate 200, a plurality of light sensing elements PD_1-PD_9 and a cover 202. The cover 202 includes a hole 204 for passing light. The light sensing device 20 may be a light sensing integrated circuit (IC) or any other device capable of light sensing functions. The light sensing elements PD_-PD_, disposed on the substrate 200, may be utilized for sensing light. Each of the light sensing elements PD_1-PD_9 may be a photo diode (PD) or any other element for sensing light, which is not limited herein. The light sensed by the light sensing elements PD_1-PD_9 may be visible light, infrared rays, ultraviolet rays or light with any wavelengths. According to different requirements or applications, various types of the light sensing elements PD_1-PD_9 may be disposed on the light sensing device 20, for sensing light having various wavelengths. In addition, the cover 202 may be utilized for sheltering the light sensing elements PD_1-PD_9, and light may pass through the hole 204 on the cover 202 and be received by the light sensing elements PD_1-PD_9 to perform light sensing. The cover 202 may be included in the package of a light sensing IC, the shell of an electronic device or any other devices capable of sheltering the light sensing elements PD_1-PD_9. During the process of manufacturing electronic products, the process mismatch may generate deviations of the light sensing elements PD_1-PD_9 inside the package or generate a deviation of the hole on the package. The fabrication mismatch may generate deviations of the light sensing elements PD_1-PD_9 inside the shell of the electronic device or generate a deviation of the hole on the shell.

Figure 3A:
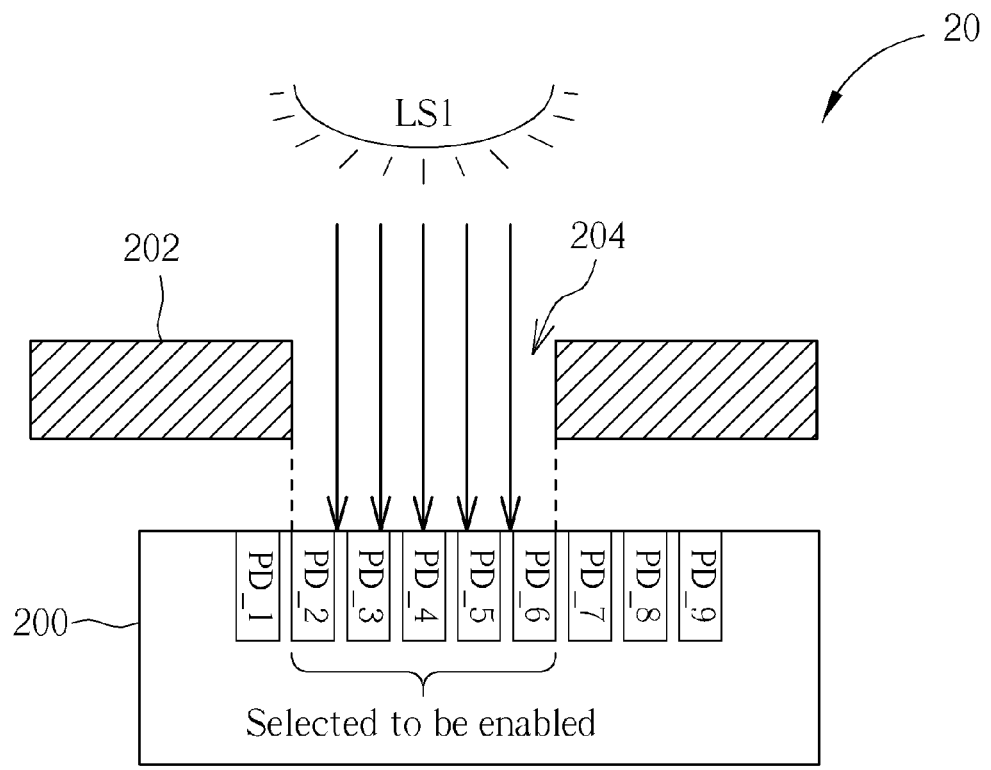
FIG. 3A, FIG. 3B, FIG. 3C and FIG. 3D are schematic diagrams of deviations appear in the location of the hole 204 relative to the light sensing elements according to embodiments of the present invention.

When the abovementioned deviations appear, the location of the hole 204 relative to the light sensing elements PD_1-PD_9 may vary. The manufacturer of electronic products may select to enable a set of the light sensing elements PD_1-PD_9 and disable light sensing elements other than the set of the light sensing elements PD_1-PD_9 according to the location of the hole 204 relative to the light sensing elements PD_1-PD_9. For example, in FIG. 2, the light emitted downward by the light source LS1 may irradiate the light sensing elements PD_3-PD_7 according to the location of the hole 204; hence, the light sensing elements PD_3-PD_7 may be selected to be enabled, and the light sensing elements PD_1, PD_2, PD_8 and PD_9 may be disabled. When a deviation appears as the case shown in FIG. 3A, the hole 204 may be deviated to the left-hand side of the light sensing elements PD_1-PD_9. In such a situation, the light emitted downward by the light source LS1 may irradiate the light sensing element PD_2-PD_6; hence, the light sensing elements PD_2-PD_6 may be selected to be enabled, and the light sensing elements PD_1 and PD_7-PD_9 may be disabled. More specifically, the manufacturer of electronic products may in turn perform testing on each of the light sensing elements PD_1-PD_9 with a specific light source, in order to determine whether to enable the light sensing elements PD_1-PD_9. For example, a light source may be disposed right above the substrate 200. When light emitted by the light source can pass through the hole 204 to directly irradiate a first light sensing element, the first light sensing element may be selected to be enabled. When light emitted by the light source passing through the hole 204 cannot directly irradiate a second light sensing element, the second light sensing element may be selected to be disabled. On the other hand, if the consistency of view angle needs to be tested, the light source may be disposed obliquely above the substrate 200. As long as the incident angle of the light emitted by the light source is within the view angle of a third light sensing element, the third light sensing element may be selected to be enabled. For example, if the light sensing elements within an irradiated range of a view angle 45 degrees needs to be enabled, a light source may be disposed obliquely above the hole 204 by 45 degrees, and light sensing elements irradiated by the light source may be selected to be enabled. Therefore, the incident angle of light may be within a view angle of 45 degrees of the set of the enabled light sensing elements. In other embodiments, selection of the light sensing elements may also be performed by other methods, which is not limited herein.

Figure 3B:
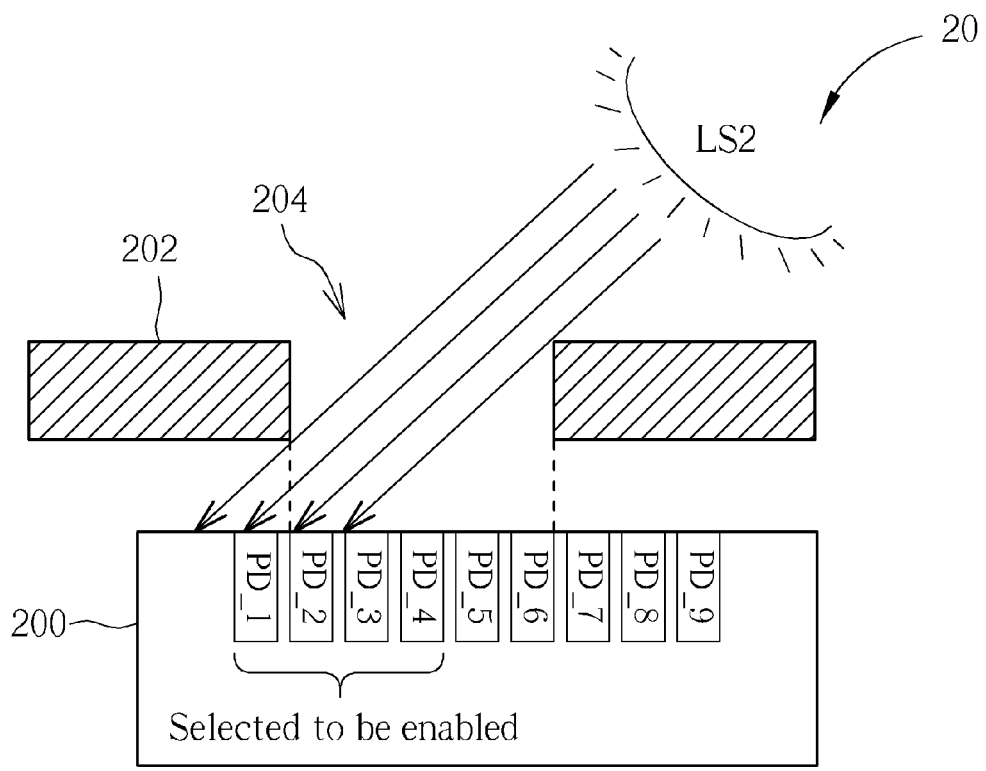
Figure 3C:
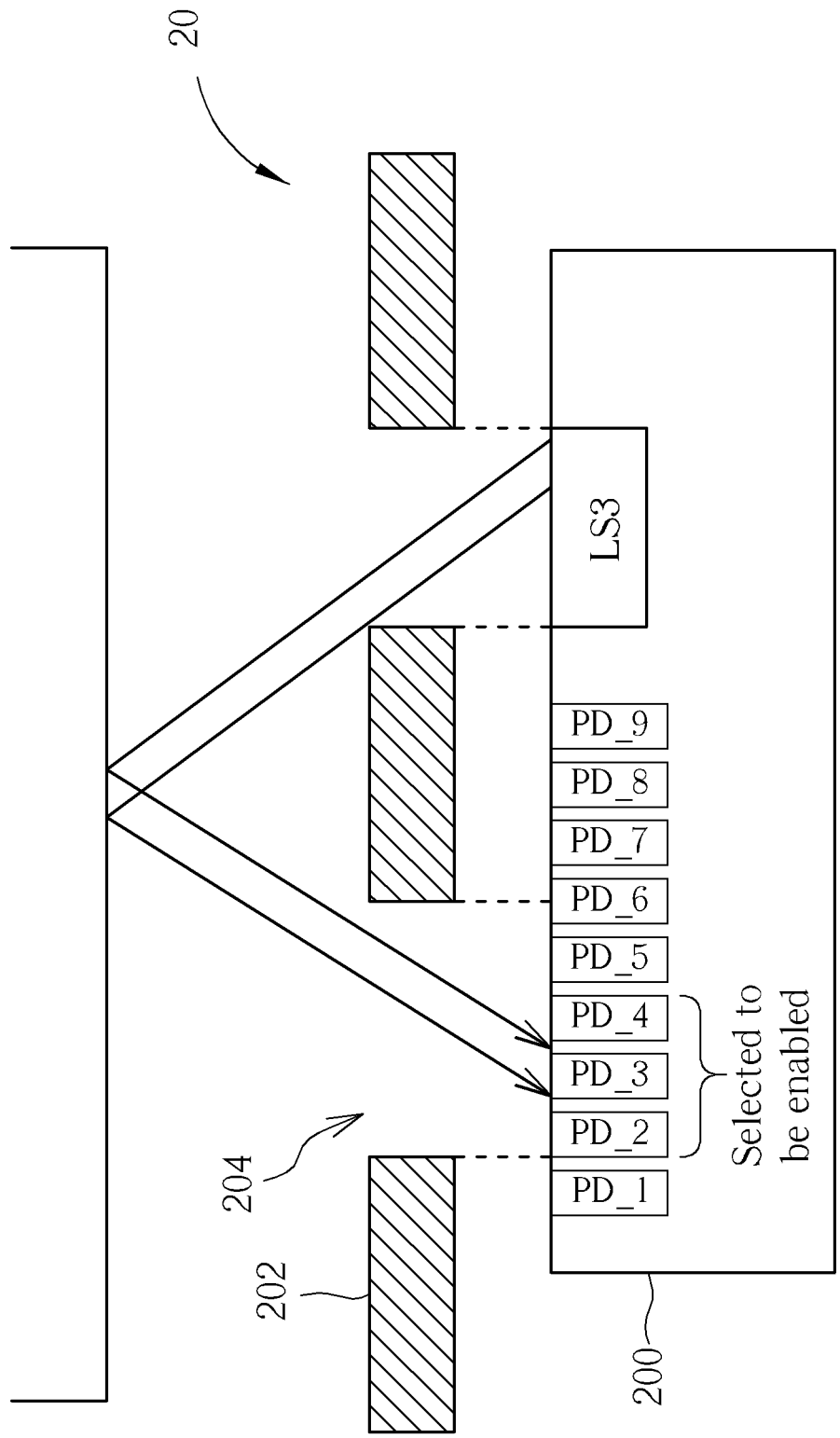
Figure 3D:
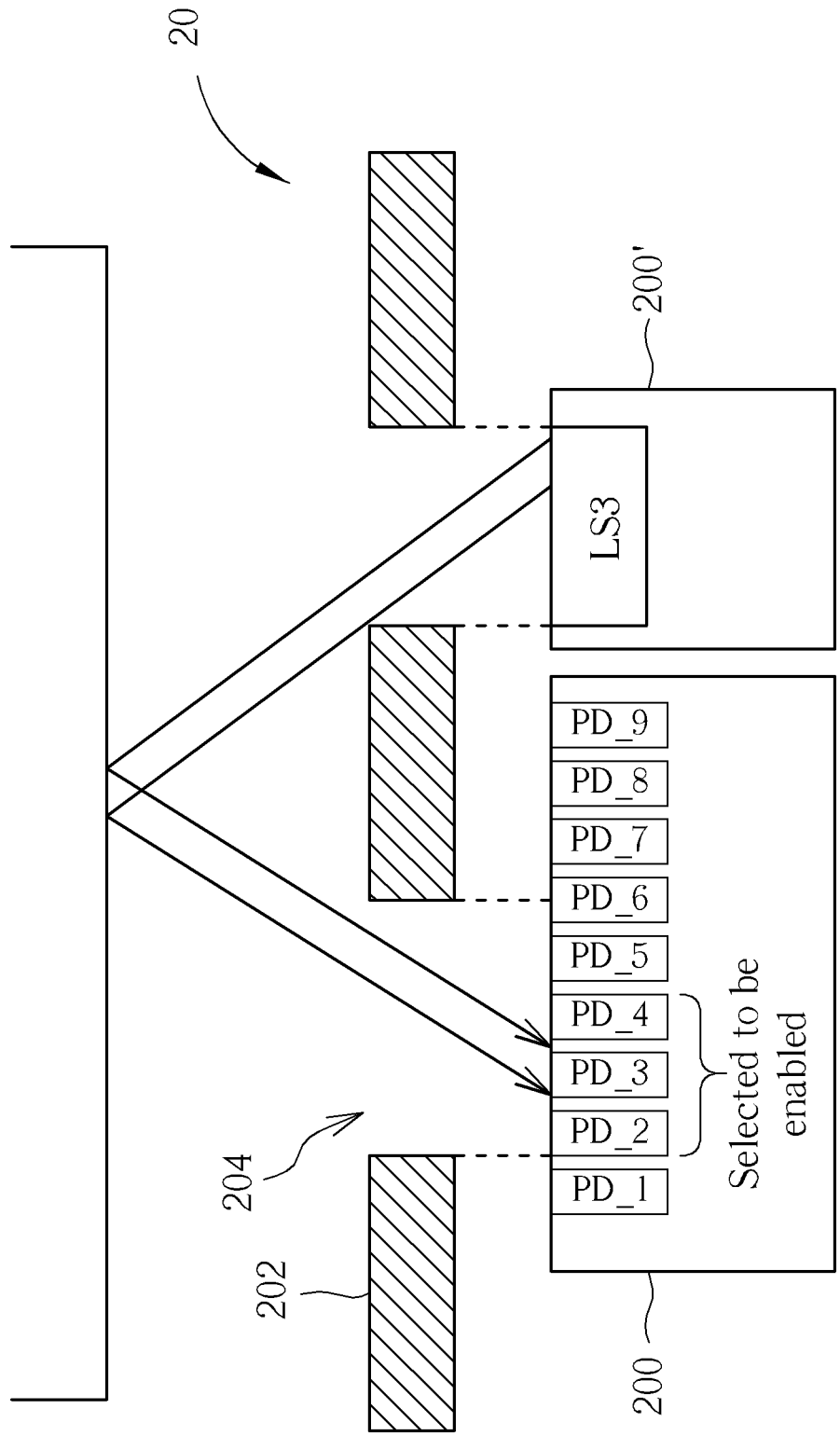

Similarly, the present invention may also solve the above-mentioned problem where obliquely incident light cannot be received by the light sensing element PD as shown in FIG. 1C, FIG. 1D and FIG. 1E. Please refer to FIG. 3B, FIG. 3C and FIG. 3D, which are schematic diagrams of deviations appear in the location of the hole 204 relative to the light sensing elements PD_1-PD_9 according to embodiments of the present invention. In FIG. 3B, the hole 204 deviates to the left-hand side of the light sensing elements PD_1-PD_9; hence, the light emitted by the light source LS2 located at the right-hand side may irradiate the light sensing elements PD_1-PD_4. The light sensing elements PD_1-PD_4 may receive the light emitted by the light source LS2, as long as they are selected to be enabled. In FIG. 3C and FIG. 3D, the hole 204 also deviates to the left-hand side of the light sensing elements PD_1-PD_9; hence, the light sensing elements located at the left-hand side (such as the light sensing elements PD2, PD3 and PD4) may also be selected to be enabled for receiving the light emitted by the light source LS3 and reflected by an external object. The main difference between FIG. 3C and FIG. 3D is that the light sensing elements PD_1-PD_9 and the light source LS3 in FIG. 3C are disposed on the same substrate 200, but the light sensing elements PD_1-PD_9 and the light source LS3 in FIG. 3D are disposed on the substrate 200 and the substrate 200', respectively. However, no matter whether the light sensing elements PD_1-PD_9 and the light source LS3 are located on the same or different substrates, a part of the light sensing elements may be selected to be enabled to receive the light emitted by the light source LS3 and reflected by an external object when deviations appear between the light sensing elements PD_1-PD_9 and the hole 204. As a result, via the selection of different light sensing elements, the present invention can solve the problem in the prior art where the deviations of the hole reduce the view angle such that the light sensing elements cannot receive the obliquely incident light.

Please note that, the difference between the light sensing device 20 and the light sensing device 10 is that the light sensing device 10 only includes a single light sensing element PD and the light sensing device 20 includes the plurality of light sensing elements PD_1-PD_9 with a smaller size. In such a situation, the manufacturer of electronic products may select to enable a part of the light sensing elements according to the location of the hole 204 relative to the light sensing elements PD_1-PD_9, so that the light sensing effect of each light sensing device may become consistent. In an embodiment, the manufacturer of electronic products may obtain the location of the hole relative to light sensing elements in each light sensing device by testing with specific light sources one by one after the fabrication of each light sensing device is accomplished, in order to determine the numbers and locations of light sensing elements to be enabled. In another embodiment, in order to save testing time, the manufacturer of electronic products may select a part of light sensing devices of the same type to perform testing, in order to obtain an average value of the location of the hole relative to light sensing elements in these light sensing devices. The manufacturer of electronic products then determines the method of enabling light sensing elements used in this type of light sensing devices according to the obtained average value.

In addition, what illustrated in FIG. 2 is the side view of the light sensing device 20, in which the light sensing elements PD_1-PD_9 are only illustrated as a row of light sensing elements in the light sensing device 20. In practice, the light sensing device 20 may include multiple light sensing elements arranged as an array. The following embodiments will illustrate various selection methods of light sensing elements via top view diagrams.

Figure 4:
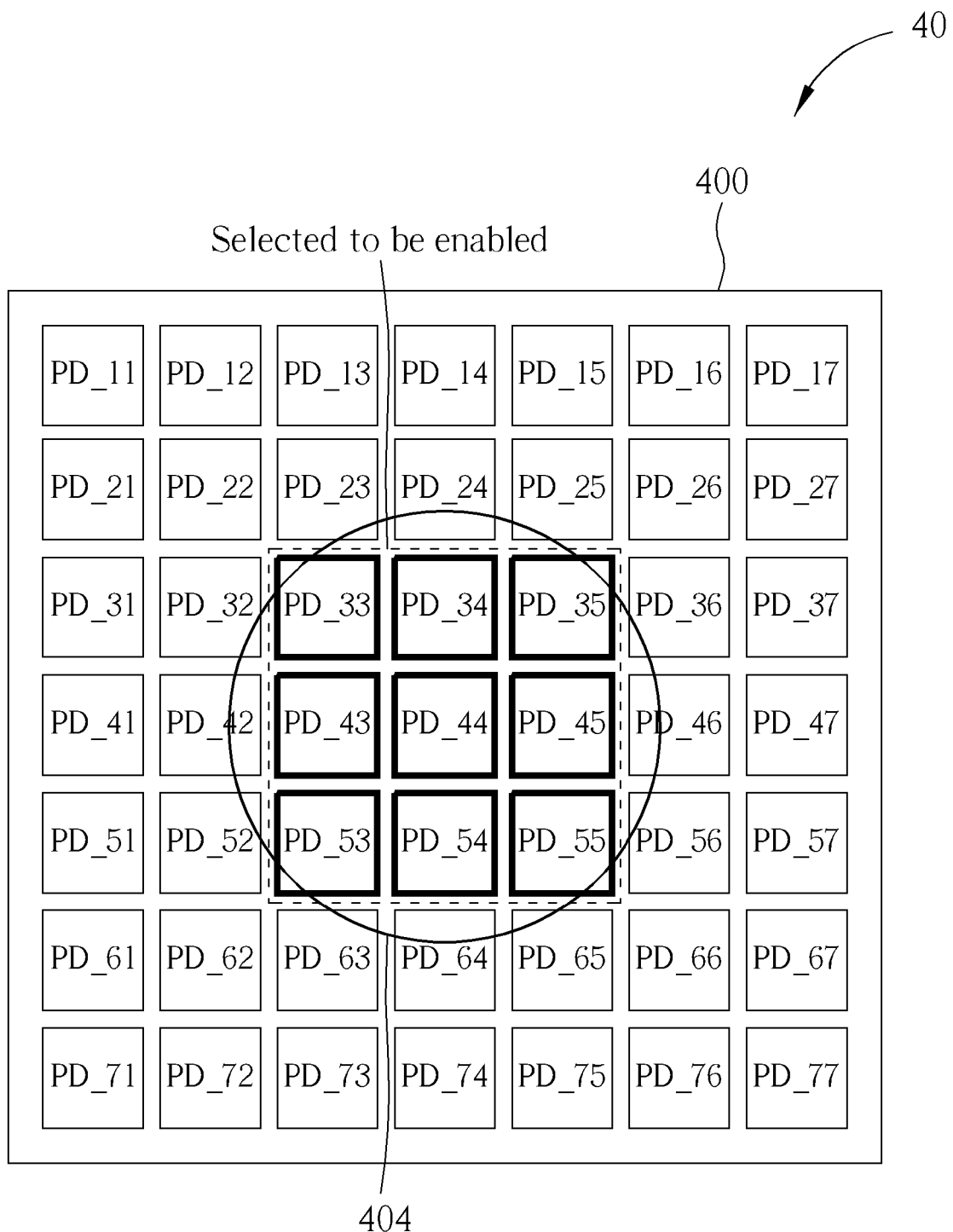
FIG. 4 is a top view diagram of a light sensing device according to an embodiment of the present invention.

Please refer to FIG. 4, which is a top view diagram of a light sensing device 40 according to an embodiment of the present invention. As shown in FIG. 4, the light sensing device 40 includes a substrate 400, light sensing elements PD_11-PD_77 and a hole 404. The light sensing elements PD_11-PD_77 are disposed on the substrate 400 and arranged as a 7×7 array, where the shapes, areas and lengths of the light sensing elements PD_11-PD_77 are the same. According to the location of the hole 404, the manufacturer of electronic products may select to enable the light sensing elements PD_33, PD_34, PD_35, PD_43, PD_44, PD_45, PD_53, PD_54 and PD_55 right below the hole 404. In other embodiments, the manufacturer may also adjust the numbers and locations of light sensing elements to be enabled if deviation appears on the location of the hole 404. For example, when the location of the hole 404 relative to the light sensing elements PD_11-PD_77 deviates leftward, the manufacturer may select to enable a set of light sensing elements including PD_32, PD_33, PD_34, PD_42, PD_43, PD_44, PD_52, PD_53 and PD_54. In addition, there may be any numbers of light sensing elements disposed on the substrate 400, and the light sensing elements may be arbitrarily arranged according to system requirements. For example, in an embodiment, the manufacturer may use light sensing elements with a smaller size to increase the number of light sensing elements on the substrate, so that consistency of the light sensitivity and view angle may be enhanced with finer selections.

Please note that the present invention provides a method of disposing a plurality of light sensing elements in a light sensing device and selecting to enable specific light sensing elements among the plurality of light sensing elements based on the process mismatch or fabrication mismatch or according to different requirements, in order to achieve consistency of the light sensitivity and view angle. Those skilled in the art can make modifications and alternations accordingly. For example, the manufacturer of electronic products may dispose a lens in the hole of the cover according to system requirements. The lens may condense light to enhance the light sensing effect of light sensing elements. In other embodiments, transparent glue may also be injected into the hole to achieve the light condensing effect as well. In addition, in the above embodiments, all of the light sensing elements on the substrate may have the same size and shape, but in other embodiments, light sensing elements with different sizes, lengths or shapes may also be disposed on the substrate according to system requirements, which is not limited herein.

Figure 5:
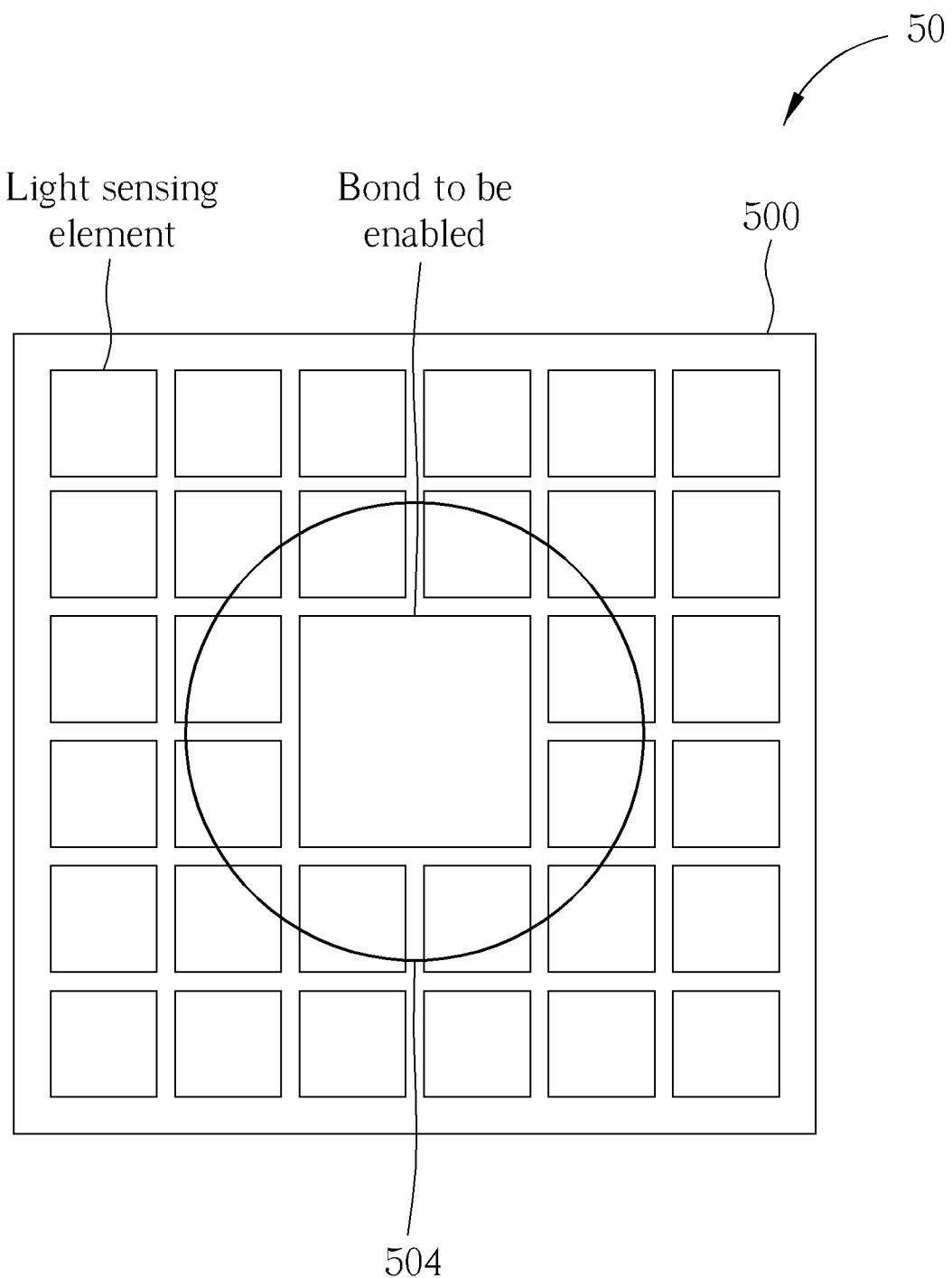
FIG. 5 is a top view diagram of a light sensing device according to an embodiment of the present invention.

Please refer to FIG. 5, which is a top view diagram of a light sensing device 50 according to an embodiment of the present invention. As shown in FIG. 5, the light sensing device 50 includes a substrate 500, a plurality of light sensing elements and a hole 504. In general, the center of the hole 504 coincides with the center of the substrate 500 having light sensing elements; hence, the light sensing elements close to the center of the substrate 500 may always be enabled as long as the hole 504 does not have excessive deviations. In such a situation, a light sensing element with a larger size may be disposed on the center of surface of the substrate 500, and surrounded by other light sensing elements with a smaller size. When the hole 504 does not deviate excessively, the light sensing element with a larger size may be bound to be enabled, and only the surrounding light sensing elements with a smaller size need to be selected according to the deviation direction of the hole 504. As a result, the number of light sensing elements may be reduced, which further reduces the cost without influencing the consistency of the light sensitivity and view angle.

In the above embodiments, the methods of selecting to enable a set of light sensing elements are to select the light sensing elements within a closed region right below the location of the hole as a set, and enable light sensing elements included in the set. In other embodiments, the manufacturer of electronic products may use a more flexible selection method to enable the light sensing elements according to various applications. For example, the manufacturer may determine light sensing elements within a first closed region according to the location of the hole relative to the light sensing elements, and then determine a second closed region among the light sensing elements within the first closed region. Therefore, the second closed region is included in the first closed region. In such a situation, the manufacturer may select the light sensing elements within the first closed region and outside the second closed region as a set, and enable the light sensing elements included in the set. The manufacturer may also disable the light sensing elements outside the first closed region external and those inside the second closed region.

Figure 6:
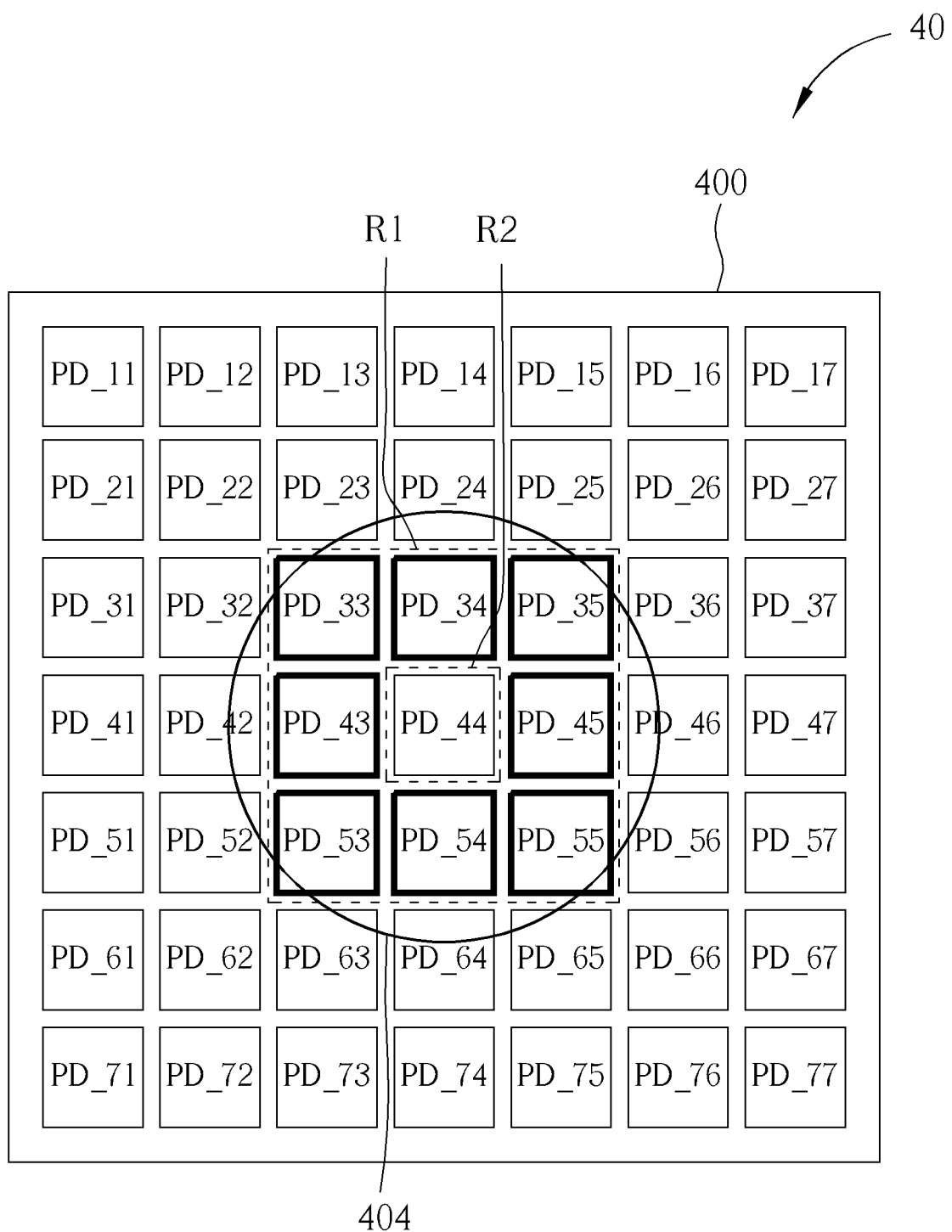
FIG. 6 is a schematic diagram of an implementation of selecting to enable the light sensing elements in the light sensing device.
Figure 7:
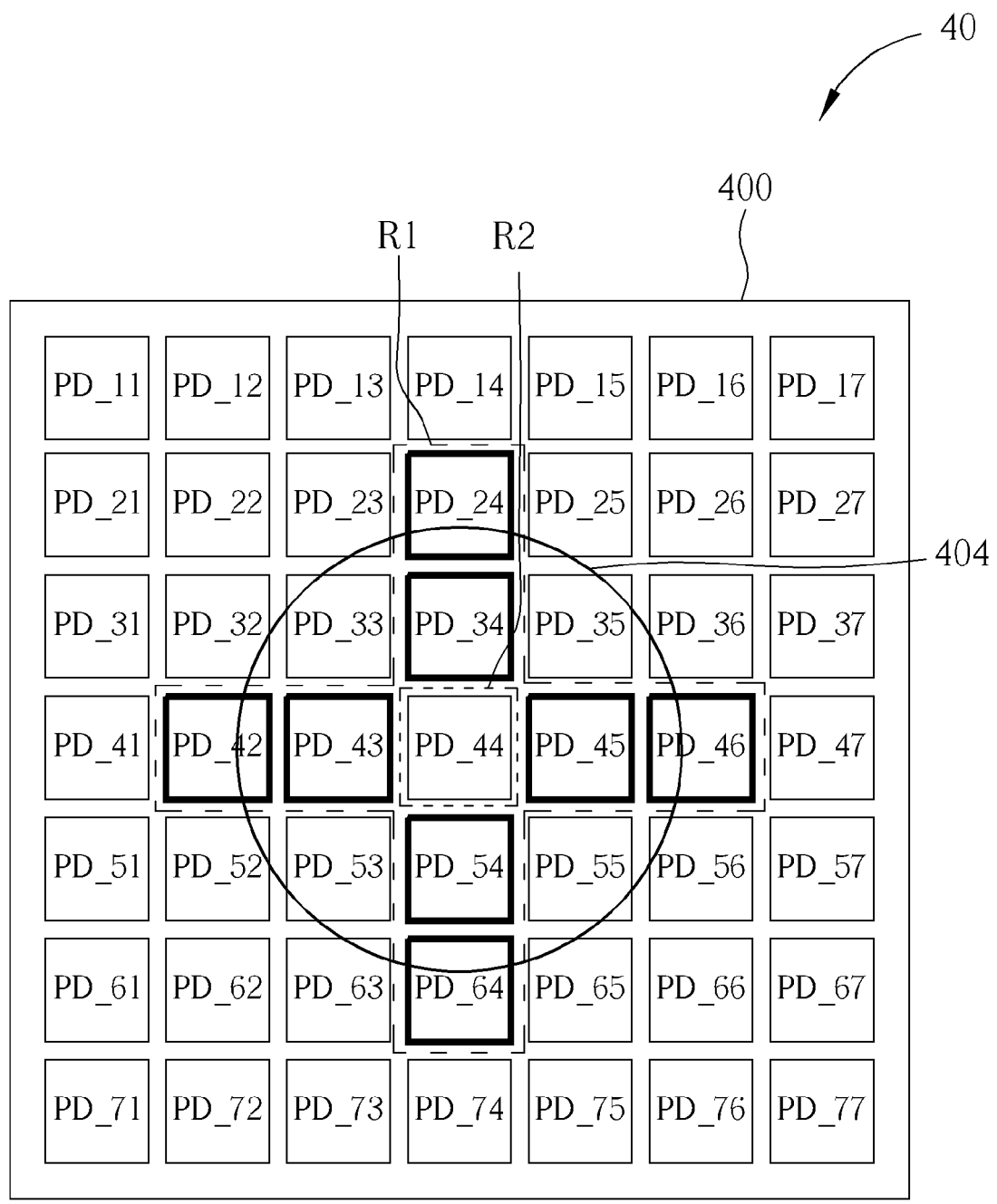
FIG. 7 is a schematic diagram of another implementation of selecting to enable the light sensing elements in the light sensing device.

Take the light sensing device 40 shown in FIG. 4 as an example. Please refer to FIG. 6, which is a schematic diagram of an implementation of selecting to enable the light sensing elements in the light sensing device 40. As shown in FIG. 6, a first closed region R1 includes a set composed of the light sensing elements PD_33, PD_34, PD_35, PD_43, PD_44, PD_45, PD_53, PD_54 and PD_55, and a second closed region R2 is located within the first closed region R1 and includes the light sensing element PD_44 located in the center of surface of the substrate 400 according to the location of the hole. The manufacturer of electronic products may select to enable the light sensing elements included in the first closed region R1 but not included in the second closed region R2, i.e., the light sensing elements PD_33, PD_34, PD_35, PD_43, PD_45, PD_53, PD_54 and PD_55, and disable the light sensing element PD_44 and other light sensing elements outside the first closed region R1. In such a situation, both of the first closed region R1 and the second closed region R2 may be circular or elliptic. In addition, please refer to FIG. 7, which is a schematic diagram of another implementation of selecting to enable the light sensing elements in the light sensing device 40. As shown in FIG. 7, a first closed region R1 is a crisscross region, which includes a set composed of the light sensing elements PD_24, PD_34, PD_42, PD_43, PD_44, PD_45, PD_46, PD_54 and PD_64. A second closed region R2 is an intersectional part of the crisscross region, which includes the light sensing element PD_44. The manufacturer of electronic products may select to enable the light sensing elements within the first closed region R1 and outside the second closed region R2 such as PD_24, PD_34, PD_42, PD_43, PD_45, PD_46, PD_54 and PD_64, in order to detect an object moving horizontally and vertically, e.g., determine whether a user of the electronic product executes a gesture of horizontal swipe or vertical scroll. In other embodiments, the oblique light sensing elements may be selected to be enabled for other purposes or requirements (e.g., game). Please note that the manufacturer may determine the ranges of the first closed region R1 and the second closed region R2 by any method, which is not limited herein. In addition, a larger number of closed regions may be determined for different applications, in order to select proper light sensing elements to perform light sensing and disable other unnecessary or redundant light sensing elements.

The embodiments of the present invention may perform various applications of light sensing devices by any methods, as long as a plurality of light sensing elements are disposed in a light sensing device and these light sensing elements may be enabled inevitably or selectively. For example, when performing ambient light sensing, the manufacturer of electronic products may select light sensing element (s) bound to be enabled and/or light sensing element (s) bound to be disabled in each light sensing device, to achieve consistency of the light sensitivity and view angle. In other embodiments, multiple different applications may be integrated into a light sensing device, wherein each light sensing element is not bound to be enabled or disabled; instead, each light sensing element may be selected to be enabled or disabled according to settings of the manufacturer of electronic products or different applications of the user, which significantly enhances the flexibility.

In the prior art, if the process mismatch or fabrication mismatch generates a deviation between the light sensing elements and the hole for receiving light, the detected light strength may be weakened. The conventional solution for this is to compensate for the weakened light signals by amplifying the circuit signals in the back-end after the light signals are converted into the circuit signals, wherein the amplification degree may be adjusted via testing. This method, however, is always accompanied by amplifications of non-ideal characteristics, e.g., noise or crosstalk, and cannot deal with the influences caused by a reduced view angle. In comparison, the present invention provides a method of disposing a plurality of light sensing elements in a light sensing device and selecting to enable specific light sensing element (s) among the plurality of light sensing elements to achieve consistency of the light sensitivity and view angle according to the situation of the process mismatch or fabrication mismatch. In addition, the manufacturer and the user of electronic products may also select to enable different light sensing elements among the plurality of light sensing elements according to different applications, which enhances the flexibility in usage of the light sensing device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light sensing device, comprising:
   a substrate;
   a plurality of light sensing elements, disposed on the substrate, for sensing light; and
   a cover, for sheltering the plurality of light sensing elements, wherein the cover comprises a hole for passing the light;
   wherein a set of the plurality of light sensing elements is selected to be turned on according to a location of the hole relative to the plurality of light sensing elements.

2. The light sensing device of claim 1, wherein each of the plurality of light sensing elements other than the set of the plurality of light sensing elements is turned off.

3. The light sensing device of claim 1, further comprising a lens or a transparent glue disposed in the hole for condensing the light.

4. The light sensing device of claim 1, wherein the plurality of light sensing elements are arranged as an array.

5. The light sensing device of claim 1, wherein shapes, areas and lengths of the plurality of light sensing elements are the same or different.

6. The light sensing device of claim 1, wherein at least one light sensing element among the plurality of light sensing elements is surrounded by light sensing elements having a size smaller than the at least one light sensing element.

7. The light sensing device of claim 1, wherein an incident angle of the light is within a view angle of the set of the plurality of light sensing elements.

8. The light sensing device of claim 1, wherein the set of the plurality of light sensing elements comprises a light sensing element within a first closed region formed according to a location of the hole.

9. The light sensing device of claim 8, wherein the first closed region further comprises a second closed region, and the set of the plurality of light sensing elements comprises a part of the plurality of light sensing elements within the first closed region and outside the second closed region, and the set of the plurality of light sensing elements does not comprise a part of the plurality of light sensing elements within the second closed region.

10. The light sensing device of claim 9, wherein the first closed region and the second closed region are circular or elliptic.

11. The light sensing device of claim 9, wherein the first closed region is a crisscross region, and the second closed region is an intersectional part of the crisscross region.

12. A method of arranging light sensing elements for a light sensing device comprising:
    disposing a plurality of light sensing elements on a substrate for sensing light;
    disposing a cover for sheltering the plurality of light sensing elements, wherein the cover comprises a hole for passing the light; and
    selecting to turn on a set of the plurality of light sensing elements according to a location of the hole relative to the plurality of light sensing elements.

13. The method of claim 12, further comprising:
    selecting to turn off each of the plurality of light sensing elements other than the set of the plurality of light sensing elements.

14. The method of claim 12, wherein the step of selecting to turn on the set of the plurality of light sensing elements according to the location of the hole relative to the plurality of light sensing elements comprises:
    selecting to turn on a first light sensing element among the plurality of light sensing elements when the light passing through the hole directly irradiates the first light sensing element; and
    selecting to turn off a second light sensing element among the plurality of light sensing elements when the light passing through the hole does not directly irradiate the second light sensing element.

* * * * *